(12) United States Patent
Harding et al.

(10) Patent No.: US 9,632,112 B2
(45) Date of Patent: Apr. 25, 2017

(54) POWER METER CONFIGURED FOR REAR AND SIDE EXPANSION

(71) Applicant: SCHNEIDER ELECTRIC USA, INC., Palatine, IL (US)

(72) Inventors: Stewart John Harding, Victoria (CA); Darrin Graham Marr, Victoria (CA); Colin Murray Slade, Victoria (CA); Marc Alan Ricci, Victoria (CA); David Andrew Hanke, Victoria (CA)

(73) Assignee: SCHNEIDER ELECTRIC USA, INC., Palatine, IL (US)

( * ) Notice: Subject to any disclaimer, the term of this patent is extended or adjusted under 35 U.S.C. 154(b) by 3 days.

(21) Appl. No.: 14/431,447

(22) PCT Filed: Sep. 28, 2012

(86) PCT No.: PCT/US2012/057910
§ 371 (c)(1),
(2) Date: Mar. 26, 2015

(87) PCT Pub. No.: WO2014/051619
PCT Pub. Date: Apr. 3, 2014

(65) Prior Publication Data
US 2015/0241480 A1      Aug. 27, 2015

(51) Int. Cl.
*G01R 1/04*          (2006.01)
*G01R 11/04*         (2006.01)
(Continued)

(52) U.S. Cl.
CPC .............. *G01R 11/04* (2013.01); *G01R 21/00* (2013.01); *G01R 22/065* (2013.01); *G01R 1/04* (2013.01)

(58) Field of Classification Search
CPC ...... G01R 11/04; G01R 21/00; G01R 22/065; G01R 1/04
(Continued)

(56) References Cited

U.S. PATENT DOCUMENTS

| 4,669,030 A | * | 5/1987 | Bannister | ............. H05K 7/1469 |
| | | | | 361/736 |
| 6,278,605 B1 | * | 8/2001 | Hill | ........................ H02B 1/26 |
| | | | | 200/307 |

(Continued)

FOREIGN PATENT DOCUMENTS

| AU | WO 2014190389 A1 | * | 12/2014 | ............. G01D 4/004 |
| AU | WO 2015024068 A1 | * | 2/2015 | ........... G01R 22/065 |

(Continued)

OTHER PUBLICATIONS

Notification of Transmittal of the International Search Report and the Written Opinion of the International Searching Authority from corresponding PCT/US2012/057910 dated Jun. 20, 2013.

*Primary Examiner* — Patrick Assouad
*Assistant Examiner* — Sean Curtis
(74) *Attorney, Agent, or Firm* — Lando & Anastasi, LLP

(57) ABSTRACT

An intelligent electronic device (100) for metering a characteristic of electricity that has a rear opening (214) and a side opening (216) in a housing of the device for accepting a connector of an expansion module through one or the other opening. The device can be configured with an integrated display module (120) that protrudes through a panel of an enclosure, and in this configuration, the expansion module connects to the device through the rear opening of the housing. The device can also be configured to be mounted on a DIN rail, and in this configuration, the expansion module connects through the side opening of the housing. The same module can be used in either configuration, without requiring that different versions of the module be made for the (Continued)

different configurations and without having to mount the device in an awkward orientation that makes it difficult to access external connections around the housing.

15 Claims, 6 Drawing Sheets

(51) Int. Cl.
   *G01R 22/06* (2006.01)
   *G01R 21/00* (2006.01)
(58) Field of Classification Search
   USPC .......................................................... 324/156
   See application file for complete search history.

(56) References Cited

U.S. PATENT DOCUMENTS

| | | | | |
|---|---|---|---|---|
| 6,329,810 | B1* | 12/2001 | Reid | G01R 22/065 324/117 H |
| D458,863 | S * | 6/2002 | Harding | D10/99 |
| D459,259 | S * | 6/2002 | Harding | D10/99 |
| 6,483,289 | B2* | 11/2002 | Reid | G01R 22/065 324/115 |
| 6,563,697 | B1 | 5/2003 | Simbeck | H02B 1/052 200/295 |
| 6,614,219 | B2* | 9/2003 | Dadian | G01R 22/065 324/142 |
| 7,184,904 | B2* | 2/2007 | Kagan | G01D 4/004 324/114 |
| 7,265,966 | B2* | 9/2007 | Dudley | G01R 1/04 361/659 |
| 7,715,176 | B2* | 5/2010 | Perez | G01R 22/065 361/659 |
| 7,881,075 | B2* | 2/2011 | Farago | H02B 1/044 361/801 |
| 9,331,404 | B2* | 5/2016 | Devanand | H01R 9/2608 |
| 2001/0043062 | A1* | 11/2001 | Reid | G01R 22/065 324/117 R |
| 2003/0117128 | A1* | 6/2003 | Dadian | G01R 22/065 324/142 |
| 2003/0132742 | A1* | 7/2003 | Harding | G01D 4/004 324/110 |
| 2005/0110481 | A1* | 5/2005 | Dudley | G01R 1/04 324/156 |
| 2007/0133152 | A1* | 6/2007 | Karim | H02B 1/042 361/647 |
| 2008/0238713 | A1* | 10/2008 | Banhegyesi | G01R 22/065 340/870.02 |
| 2008/0284614 | A1* | 11/2008 | Perez | G01R 22/065 340/870.02 |
| 2008/0291643 | A1* | 11/2008 | Farago | H02B 1/044 361/747 |
| 2012/0206848 | A1* | 8/2012 | Gillespie | H01T 4/06 361/104 |
| 2013/0222962 | A1* | 8/2013 | Jonsson | G01R 19/0092 361/115 |
| 2013/0314245 | A1* | 11/2013 | Sykes | G01D 4/004 340/870.02 |
| 2014/0199864 | A1* | 7/2014 | Devanand | H01R 9/2608 439/116 |
| 2014/0265562 | A1* | 9/2014 | Thompson | H02J 4/00 307/17 |
| 2015/0241480 | A1* | 8/2015 | Harding | G01R 22/065 324/156 |
| 2015/0316944 | A1* | 11/2015 | Thellend | H02J 13/001 700/292 |

FOREIGN PATENT DOCUMENTS

| | | | | |
|---|---|---|---|---|
| DE | EP 2199750 A1 * | 6/2010 | | H05K 7/1428 |
| DE | 102008063878 A1 | 7/2010 | | |
| DE | 102009050606 A1 * | 4/2011 | | G01R 22/065 |
| DE | EP 2315041 A2 * | 4/2011 | | G01R 22/06 |
| EP | 2096415 A1 | 9/2009 | | |
| EP | 2199750 A1 | 6/2010 | | |
| EP | 2315041 A2 | 4/2011 | | |
| GB | 2272530 A | 5/1994 | | |
| GB | 2276728 A | 10/1994 | | |
| GB | 2295683 A * | 6/1996 | | G01R 22/00 |
| GB | 2326243 A * | 12/1998 | | G01R 11/02 |
| GB | CA 2477570 A1 * | 10/2003 | | G01R 1/04 |
| GB | WO 03081262 A1 * | 10/2003 | | G01R 1/04 |
| WO | 97/018611 A2 | 5/1997 | | |
| WO | WO 2008144308 A1 * | 11/2008 | | G01R 22/065 |

* cited by examiner

POWER METER CONFIGURED FOR REAR AND SIDE EXPANSION

CROSS-REFERENCES TO RELATED APPLICATIONS

This application is the U.S. National Phase Application under 35 U.S.C. §371 of International Application No. PCT/US2012/057910, filed Sep. 28, 2012. This prior application is incorporated by reference herein in its entirety.

FIELD OF THE INVENTION

The present disclosure relates generally to intelligent electronic devices (IEDs), and more particularly, to power meters configured for attaching expansion modules on the side or the rear of the base IED unit.

BACKGROUND

A basic functionality of a power meter is to measure one or more characteristics of electricity, such as current or voltage. A power meter can be attached to a DIN rail or mounted through a cutout to a door of an electrical panel enclosure for power monitoring equipment. A power meter can conventionally include connectors accessible from a rear of the housing for making connections to the power meter, including power supply, I/O, voltage inputs, current inputs, and communications. In addition, certain base power meter units include an expansion connector accessible through the housing of the base unit for connecting expansion modules that enhance or supplement the standard functionality of the power meter. These expansion modules have a separate housing from the base power meter unit and are connected to the expansion connector through the housing of the base power meter unit. When the base power meter unit has a DIN 96 format, the expansion modules are connected to the back of the power meter unit when it is installed through a door panel. However, when an end-user wishes to install the same power meter unit on a DIN rail and leave open the option for future expansion, the base unit must be rotated on its side 90 degrees to allow expansion modules to be compatible with the DIN rail. As a result, the connectors are rotated on their side, and the safety and informational labels on the housing of the base unit are also rotated on the side, making it difficult to access to the connectors with a screwdriver, for example, or to read the labels.

What is needed is a new solution that does not require the base power meter unit to be rotated when mounted to a DIN rail or through a door panel yet allows the connectors to be easily accessible and the safety and informational text on the labels on the housing of the base unit to be readable right-side up regardless of how the base unit is installed.

SUMMARY

According to an aspect of the present disclosure, an intelligent electronic device (IED) for measuring a characteristic of electricity is disclosed. The IED includes: a housing of a base unit having a front, a rear, and a first side opposite a second side connected to the front and to the back, the housing defining an interior volume and including therein a sensor configured to sense a characteristic of electricity, the rear of the housing including a rear opening through which a first connector is accessed when present in the housing, the first connector for connecting to a corresponding connector of an expansion module of a type when mounted to the base unit, and the first side of the housing including a side opening through which a second connector is accessed when present in the housing, the second connector for connecting to the corresponding connector of the expansion module of the same type when mounted to the base unit.

The front can include a DIN slot configured to engage a DIN rail. The IED can further include a cover positioned on the rear to completely cover the rear opening. The front can include a display connector configured to receive a corresponding connector of a display module that has a display module housing and a video display device. The front can further include at least one display mount configured to secure the display module to the base unit, causing the display connector to mechanically and electrically couple to the corresponding connector of the display module.

A label can be affixed to the first side to completely cover the side opening. The housing can include a top opposite a bottom, and wherein the rear opening is located a first distance from the first side and a second distance from the top. The side opening can be located the first distance from the rear and the second distance from the top, such that the corresponding connector of the expansion module, when connected to the base unit, connects to the second connector through the side opening in a side configuration or to the first connection through the rear opening in a rear configuration.

The expansion module can be rotated in two directions about two different axes to switch between being connected to the first side and to the rear of the base unit. The IED can further include a backplane in the housing proximate the rear of the base unit. The backplane can include the first electrical connector having a female receptacle that is positioned to coincide with the rear opening. The backplane can include the second electrical connector having a female receptacle that is positioned to coincide with the side opening.

An overall height and an overall width dimension of the expansion module does not have to exceed a corresponding overall height and overall width dimension of the base unit or an overall depth and overall height dimension of the base unit. The housing can include at least two pieces, where each of the side opening and the rear opening spans across the at least two pieces of the housing.

The housing can include a top opposite a bottom, and the IED can further include connectors accessible from the top and the bottom of the housing. The connectors can include one or more of a current input connector for receiving one or more current inputs carrying a current sensed by the sensor, a voltage input connector for receiving one or more voltage inputs providing a voltage sensed by the sensor, a data connector for receiving input and output signals between the device and an external system external to the device, a power supply connector supplying power signals for powering electronic components of the device including, or a communications connector configured to carry communication signals to a remote monitoring and control system or to another device. The IED can be a meter device.

The first and second connectors can be of the same type and have the same or different mating arrangement. The side opening and the rear opening can have the same dimensions.

The corresponding connector of the expansion module, when the expansion module is mounted to the base unit, can be configured to be connected to either the first connector through the side opening or to the second connector through the rear opening.

According to another aspect of the present disclosure, a method of assembling an intelligent electronic device (IED) for measuring a characteristic of electricity is disclosed. The method includes the steps of: providing a first housing having a back opening in a back of the first housing and a second housing having a side opening in a side of the second housing; selecting the first housing or the second housing based on an installation configuration of the IED, the installation configuration being selected from the group consisting of (a) installing the meter device through a panel and (b) mounting the IED to a DIN rail along a second side opposite the side through which the side opening is provided; and responsive to the selecting, installing a sensor module into the selected housing to form the IED, the sensor module including a sensor configured to sense a characteristic of electricity.

The method can further include: in either order, rotating an expansion module about a first axis extending between a top and a bottom of the IED and rotating the expansion module about a second axis extending between opposite sides of the IED, so as to permit the expansion module to be connected to the sensor module through the back opening or through the side opening.

The method can further include rotating an expansion module about at least one axis so as to permit the expansion module to be connected to the sensor module through the back opening or through the side opening following the rotation.

The foregoing and additional aspects of the present disclosure will be apparent to those of ordinary skill in the art in view of the detailed description of various aspects, which are made with reference to the drawings, a brief description of which is provided next.

BRIEF DESCRIPTION OF THE DRAWINGS

The foregoing and other advantages of the present disclosure will become apparent upon reading the following detailed description and upon reference to the drawings.

DETAILED DESCRIPTION

Figure 1:
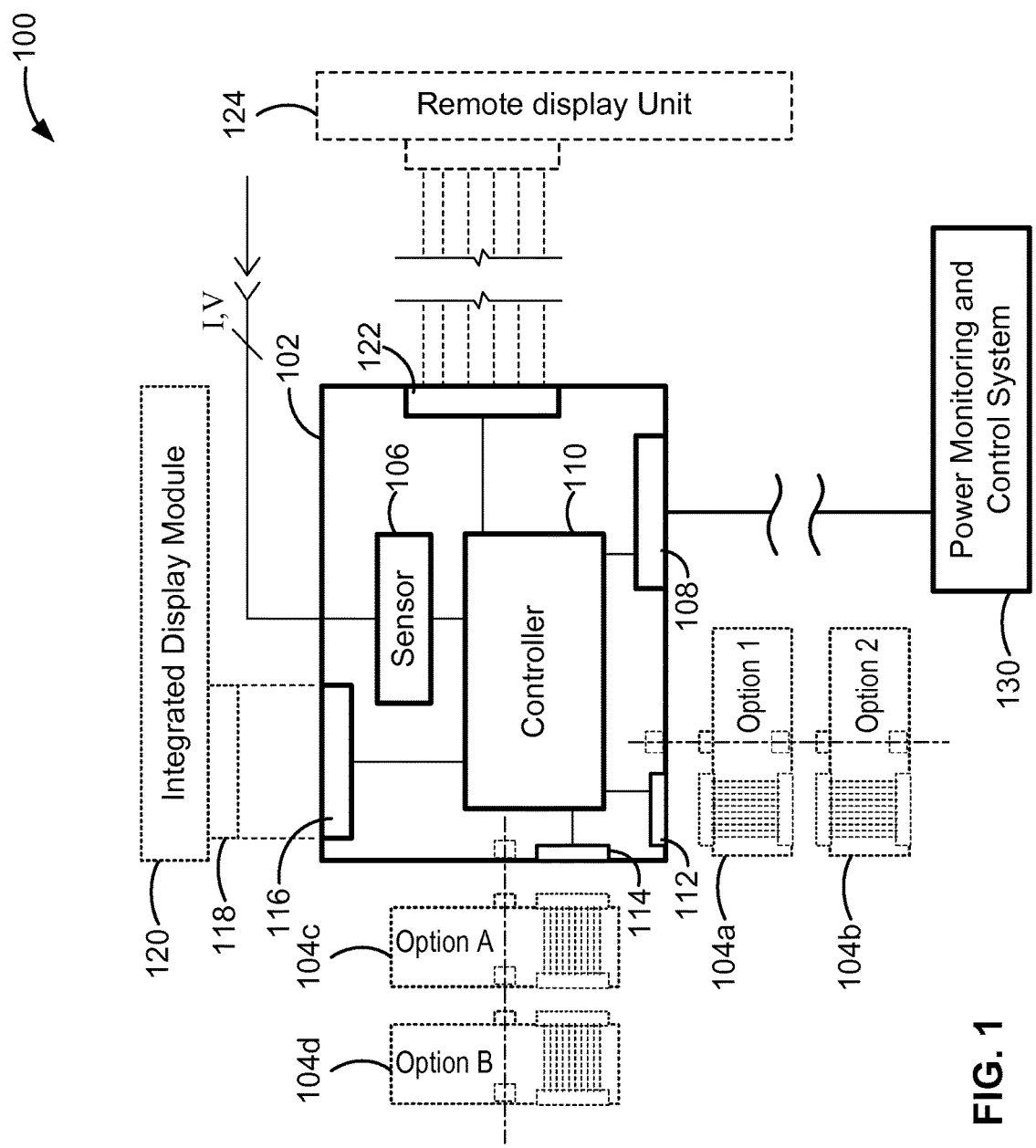
FIG. 1 is a functional block diagram of an intelligent electronic device (IED) having a housing that can accept a separately housed expansion module along at least two distinct surfaces of the housing.

Referring to FIG. 1, a functional block diagram of an intelligent electronic device (IED) 100, such as a meter device, is shown. The meter device includes a base unit 102 and one or more expansion modules 104*a*, 104*b*, 104*c*, 104*d* (generally designated as 104). The base unit 102 includes a sensor 106, which can include one or more sensors each configured to sense a characteristic of electricity, such as current or voltage. The base unit 102 further includes a controller 110. The electronic components in the base unit 102 can be provided on one or more printed circuit boards or backplanes. The controller 110 is coupled to a number of interfaces that allow communication with various systems external to the base unit 102. For example, the controller 110 can be coupled to a communications interface 108 that is coupled to a power monitoring and control system 130 that is external and remote from the IED 100. The communications interface 108 can include an electrical port, such as an RS485 port, for receiving an RS485 plug connector. The controller 110 is coupled to a first connector interface 112 and optionally to a second connector interface 114. The first connector interface 112 can include a first connector, such as described below in connection with FIG. 2. The second connector interface 114 can include a second connector, such as described below in connection with FIG. 2. A connector interface, as used herein, can be an opening dimensioned to receive a connector or plug therethrough. Alternately, a connector interface can include a connector or a plug (such as of the male or female type) or an outlet or a port. Connectors of the same "type" as used herein can have the same or different mating arrangement (e.g., both can be male or both can be female or one can be male and the other female and still be of the same "type") and the same or different orientation (e.g., right-angle orientation or straight orientation). The term "type" can encompass the number of pins and the form factor of the connector. Alternately, the connectors of the same "type" can have the same trade designation or nomenclature as used and understood by those of ordinary skill in the art to which the present disclosure pertains, such as "USB," "DB-25," or "RJ45," to name a few examples. Likewise, any of the expansion modules 104 can be of the same type and used in either orientation as disclosed herein. By the same type, it is meant that the expansion module 104 has the same physical form factor and optionally the same functionality.

The controller 110 can also be coupled to a display interface 116 that can include a display port or connector for receiving a corresponding display connector or plug 118 from an integrated display module 120. The integrated display module 120 includes at least one display mount configured to secure the integrated display module 120 to the base unit 102. By "integrated" it is meant that the display module 120 is attached to the base unit 102 through the connectors 118, 120 and the display mount(s) and thereby forms an integrated piece.

Figure 3:
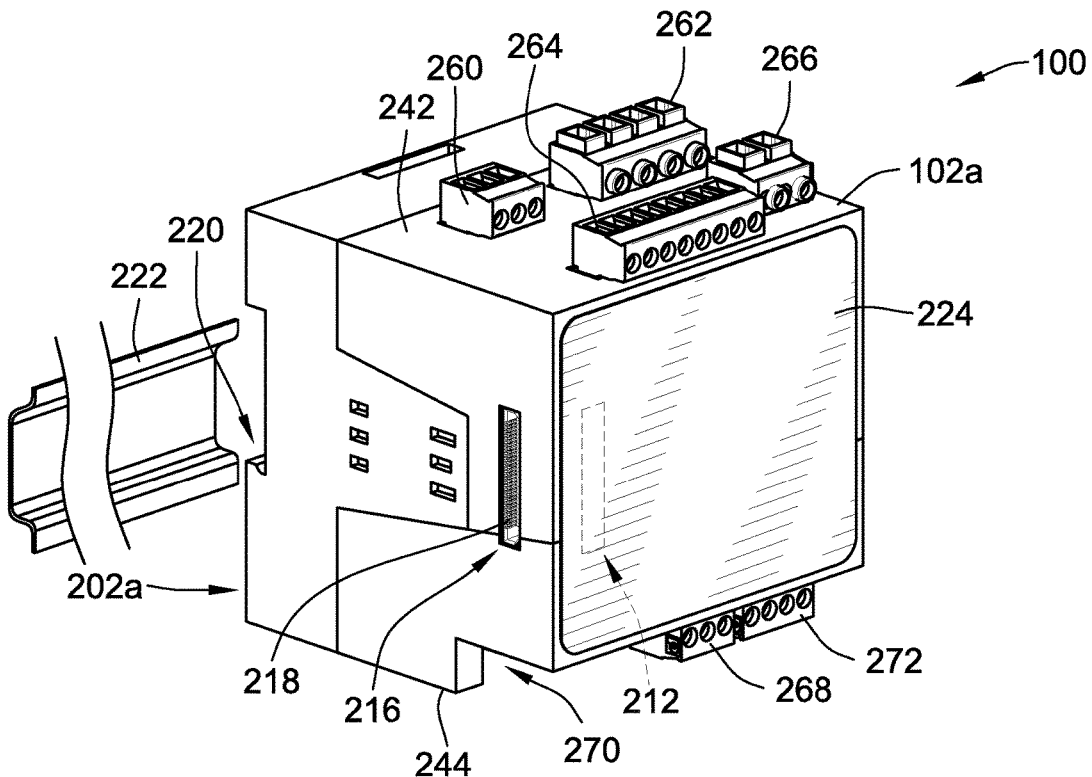
FIG. 3 is a perspective rear view of a DIN-mounted IED, such as the IED shown in FIG. 1, having an opening in a side of its housing for accepting the same connector from the same expansion module.
Figure 5:
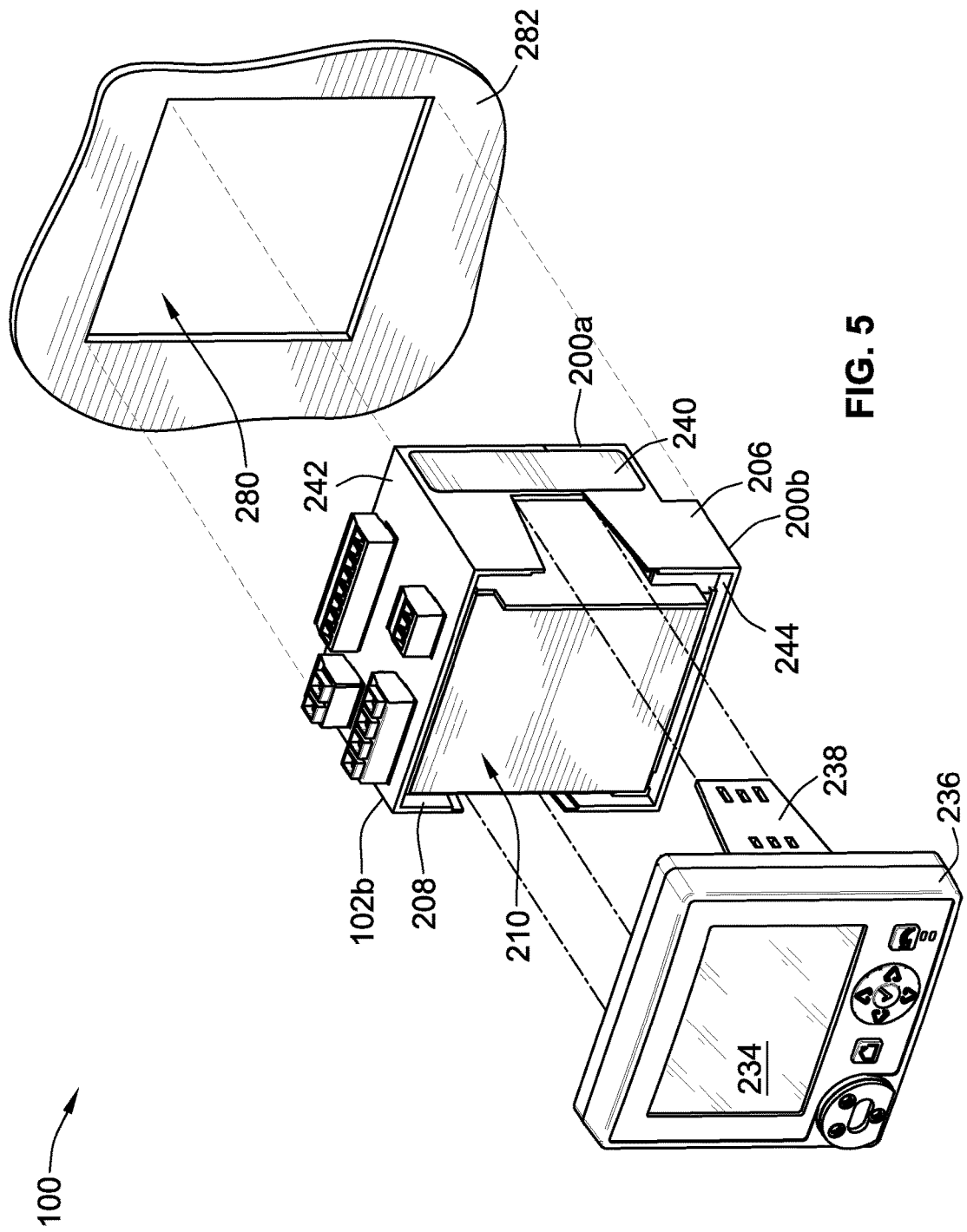
FIG. 5 is an exploded perspective front view of the IED shown in FIG. 2 showing how the display module is installed through a panel door of an enclosure.

The base unit 102 can be configured to be mounted on a DIN rail, such as shown in FIG. 3, or through a cutout 280 in a door panel 282, such as shown in FIG. 5. For convenience, the former configuration shall be referred to herein as a DIN-mounted configuration, whereas the latter configuration shall be referred to herein as an integrated configuration (integrated referring to the integrated display module 120 that can be attached to the base unit 102). When the base unit 102 is configured in the DIN-mounted configuration, the controller 110 can be coupled to a remote display interface 122, which is operatively coupled to a remote display unit 124 (shown in FIG. 1). The remote display unit 124 is external to and remote from the base unit 102 and can display information from the base unit, such as information relating to the characteristic of electricity sensed by the sensor 106. Any of the interfaces 108, 112, 114, 116, 122 can include a connector, a plug, a port, and can be configured to receive a corresponding connector, port, or plug from an external unit that is electrically coupled to the interface 108, 112, 114, 116, 122.

Figure 2:
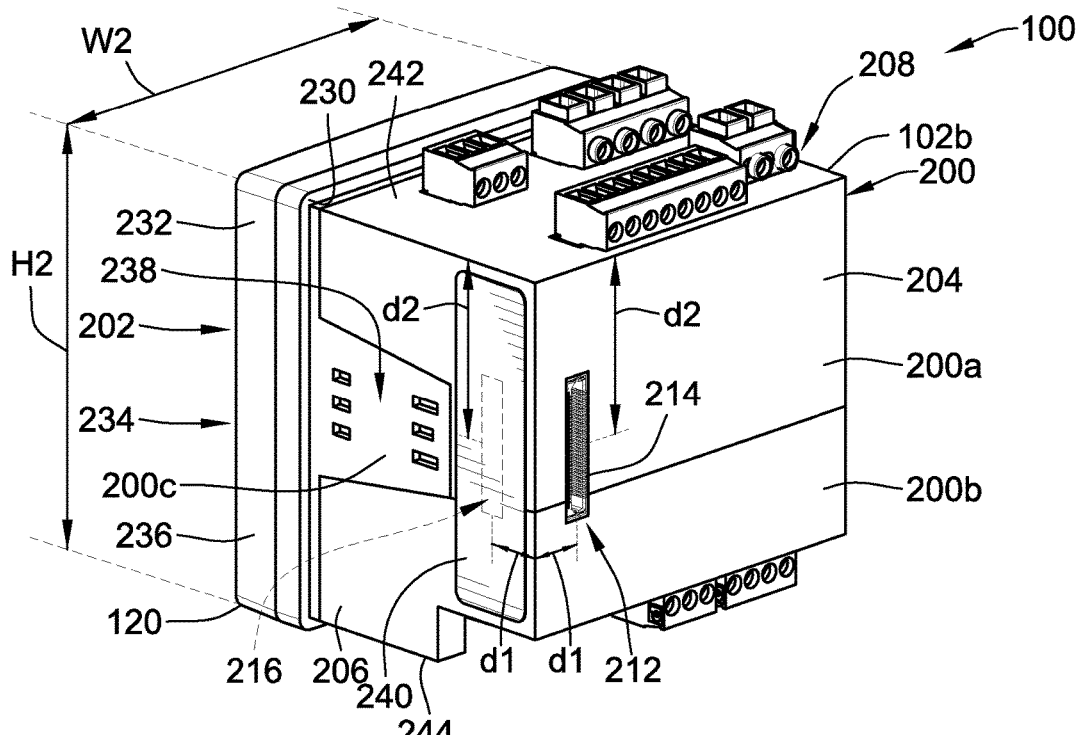
FIG. 2 is a perspective rear view of an intelligent electronic device, such as the IED shown in FIG. 1, having an integrated display module and an opening in a rear of its housing for accepting a connector from an expansion module.

The base unit 102 includes a housing, designated generally by 200, that is formed of one or more pieces 200a, 200b, 200c as shown in FIG. 2. The housing has a front 202, a rear (or back) 204, and a first side 206 opposite a second side 208. The first and second sides 206, 208 are each connected to the front 202 and to the back 204. The housing 200 defines an interior volume 210 (shown in FIG. 5), which houses the sensor 106 configured to sense a characteristic of electricity, such as current or voltage. The rear (or back) 204 includes a rear opening (or back opening) 212 (shown in FIG. 2) through which a first connector 214 of a type is accessed when present in the housing 200. By "when present in the housing 200" it is meant that in some configurations, the first connector 214 is not present in the housing 200, but the rear opening 212 is still provided. The first side 206 of the housing includes a side opening 216 through which a second connector 218 of the same type as the first connector 214 is accessed when present in the housing 200 (shown in FIG. 3). As noted above, the housing 200 includes both the rear opening 212 and the side opening 216 (shown in FIG. 4). Note that the side opening 216 can be formed in the second side 208 instead of in the first side 206. Although the housing 200 example shown as illustrated is formed of three pieces 200a, 200b, 200c, the housing 200 can alternately be formed from fewer or more pieces. The number of pieces of the housing is not a salient feature of aspects of the present disclosure. In the illustrated example, the side opening 216 and the rear opening 212 each spans across two pieces 200a, 200b of the housing 200 of the base unit 102.

Figure 4:
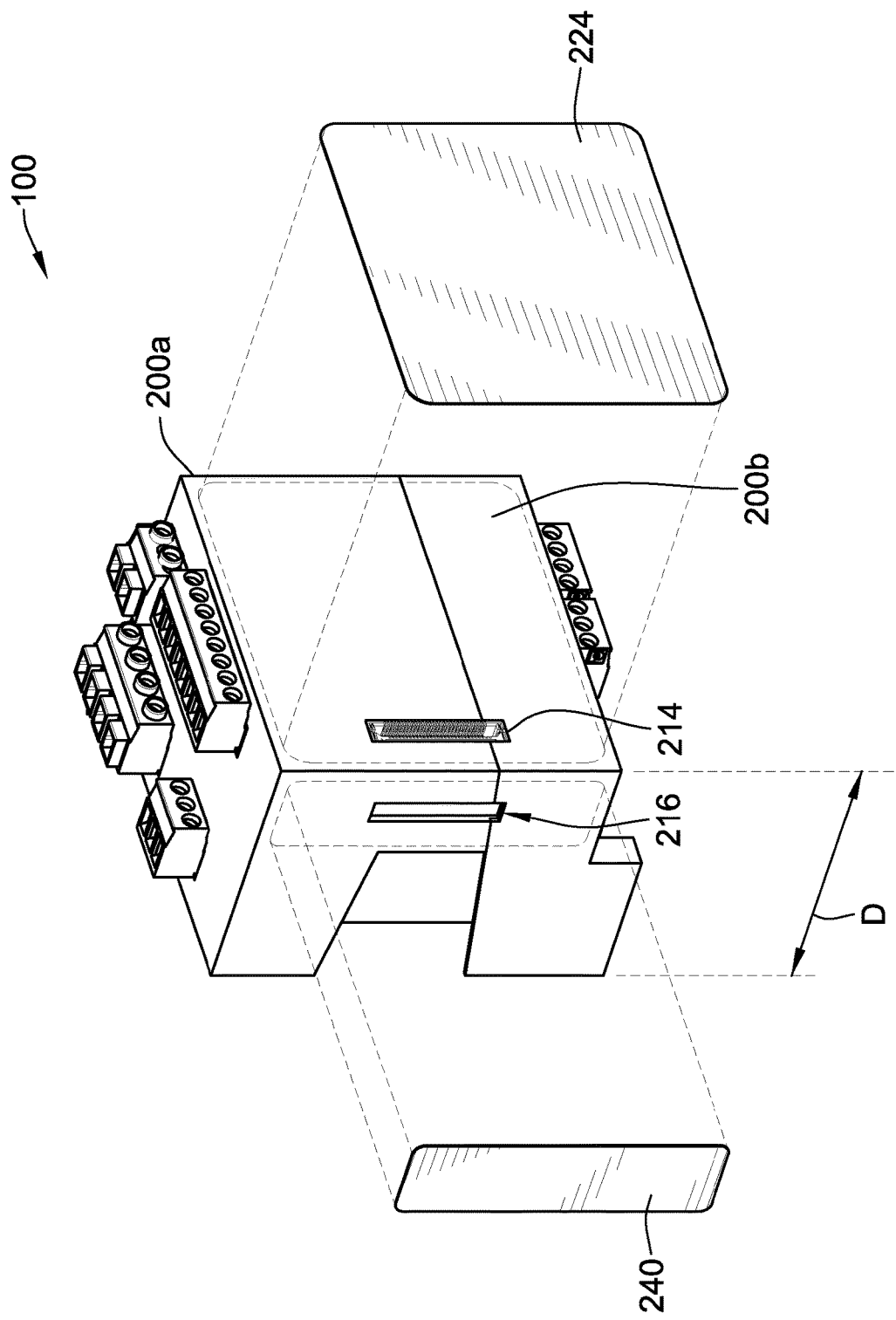
FIG. 4 is a perspective rear view of part of an IED, such as the IED shown in FIG. 2 or FIG. 3, showing a rear opening and a side opening with labels in exploded view that can be placed over the respective openings depending on the configuration of the IED.

As mentioned above, there are two different configurations of the base unit 102 shown in the drawings: a DIN-mounted configuration shown in FIG. 3, and an integrated configuration shown in FIG. 2. The base unit is generally designated as 102, and the DIN-mounted configured base unit is designated as 102a, whereas the integrated configured base unit is designated as 102b. Otherwise like reference numbers refer to like elements in the figures. Note that in the DIN-mounted configuration, the base unit 102a includes the second connector 218 and lacks a first connector 212 (see FIG. 3), but in the integrated configuration, the base unit includes the first connector 212 but lacks the second connector 218 (see FIG. 2). Alternately, in both configurations, both connectors 212, 218 can be present (e.g., FIG. 1). In both configurations, both rear and side openings 212, 216 are present in the housing 200 (FIGS. 4, 6, 7).

As shown in FIG. 3, in the DIN-mounted configured base unit 102a, the front 202a includes a DIN slot 220 configured to engage a DIN rail 222. An optional cover, such as a label 224, is affixed to or positioned on the rear 204 of the base unit 102a to completely cover the rear opening 212.

Figure 6:
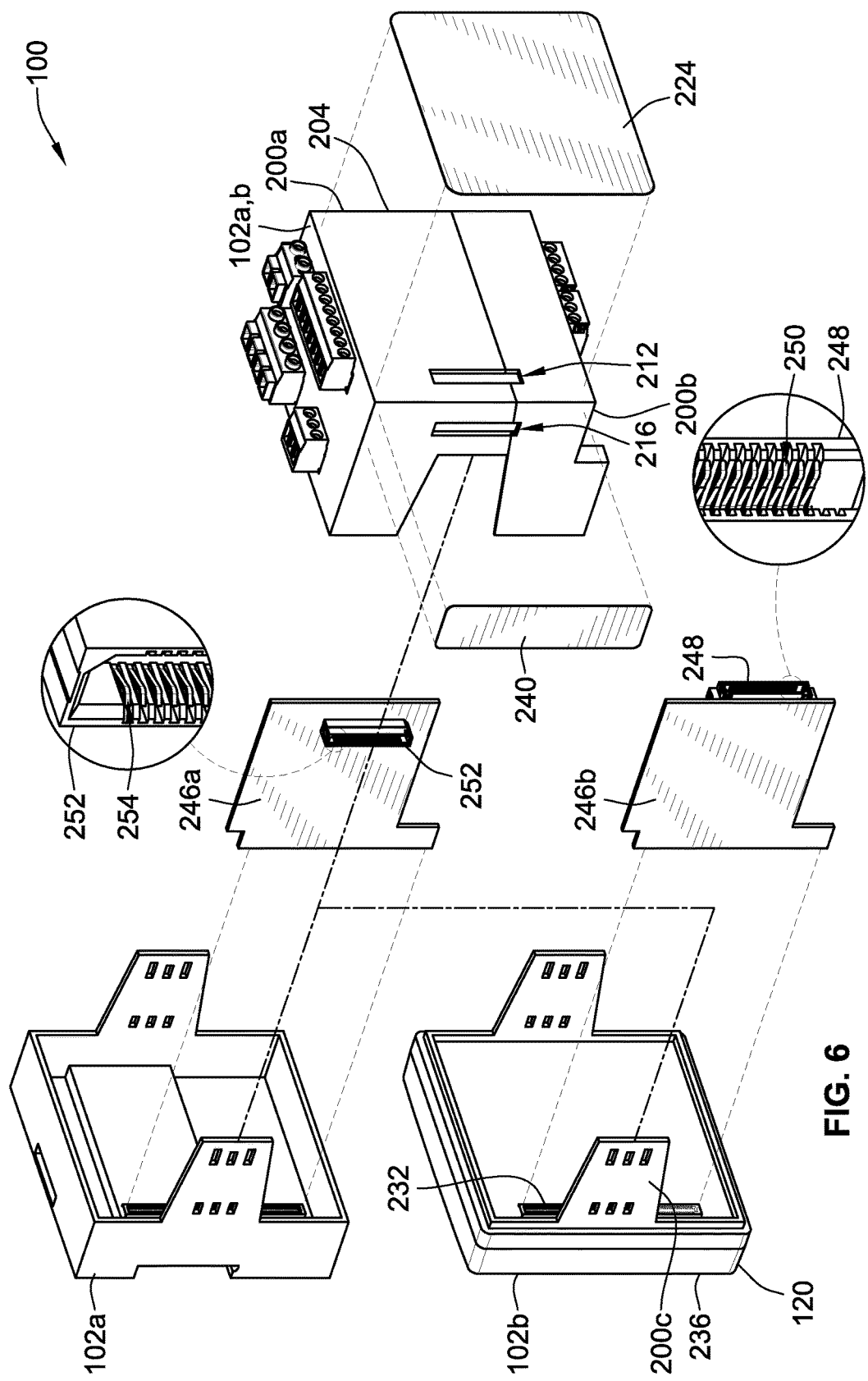
FIG. 6 is an exploded view of various components that can be selected for the IED in different configurations.
Figure 7:
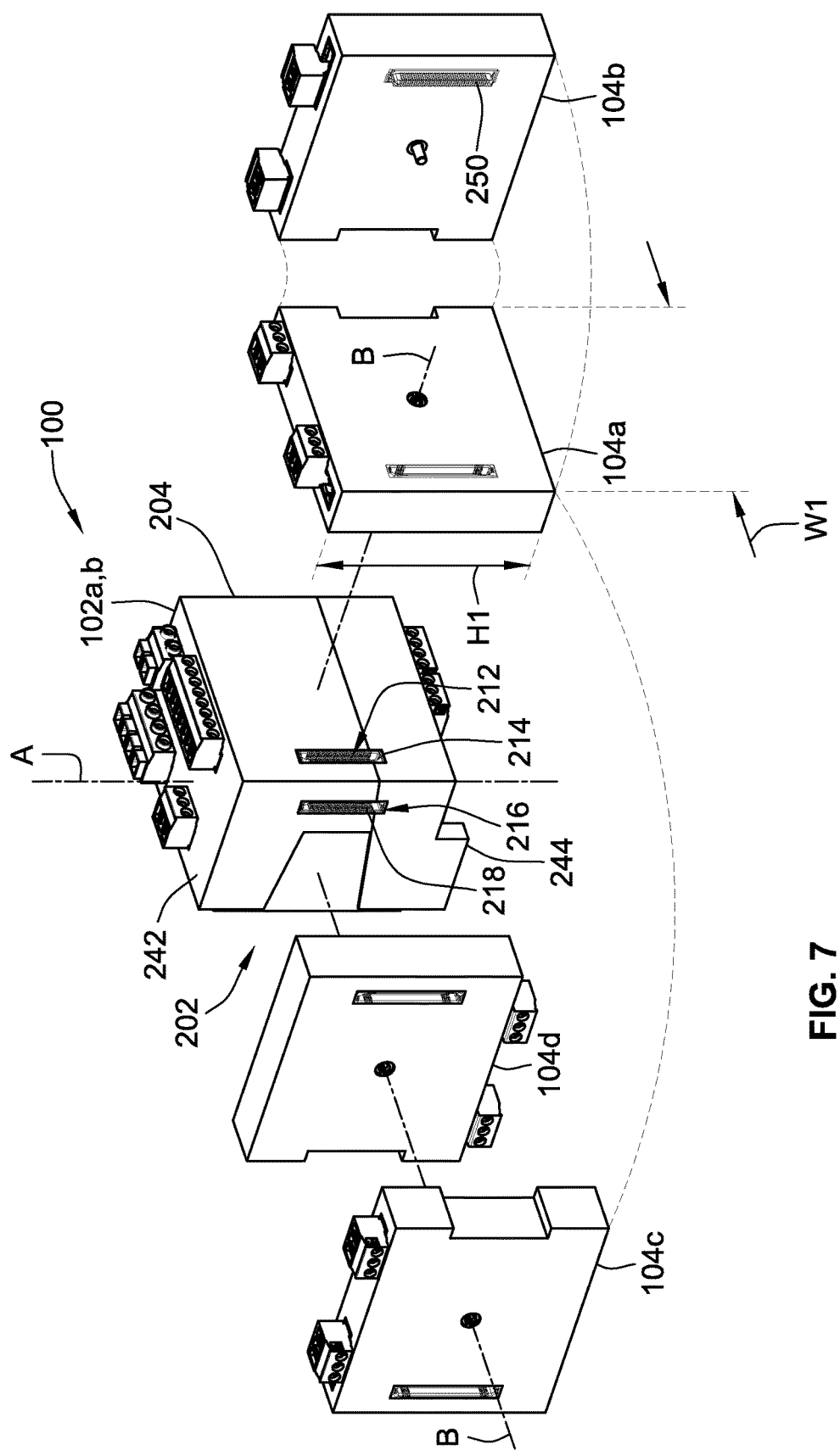
FIG. 7 illustrates a sequence of how an expansion module can be rotated twice about two axes to change its connection between the rear of the housing of the IED and its side.

As shown in FIGS. 2 and 6, in the integrated configured base unit 102b, the front 202 includes a display connector 230 configured to receive a corresponding connector 232 of a display module 120 that has a display module housing 236 and a video display device 234. The front 202 further includes at least one display mount 238 configured to secure the display module 102 to the base unit 102b, causing the display connector 230 to mechanically and electrically couple to the corresponding connector 232 of the display module 102. An optional label 240 is affixed to the first side 206 to completely cover the side opening 216. As mentioned above, in the integrated configuration, the base unit 102b can lack the second connector 218 that is present in the DM-configured base unit 102a.

The housing includes a top 242 opposite a bottom 244. Note that the terms "front," "rear" or "back," "side," "top," and "bottom" are not necessarily indicative of their orientation relative to gravity or earth but rather to differentiate the different surfaces of the housing from one another for ease of discussion. In some implementations, some or all of the adjacent surface pairs that form the housing of the base unit 102a or 102b (e.g., rear and either side, front and either side, top and either side, bottom and either side) can be perpendicular to one another. As shown in FIG. 2, the rear opening 212 is located a first distance d1 from the first side 206 and a second distance d2 from the top 242. These measurements can be taken from the center of the rear opening 212. The side opening 216 is located the first distance d1 from the rear 204 and the second distance d2 from the top 242, such that a connector 250 of an expansion module 104, when connected to the base unit 102, connects to the second connector 218 through the side opening 216 in the DIN-mounted configuration or to the first connector 214 through the rear opening 212 in the integrated configuration.

The expansion module 104 is rotated in two directions about two different axes A, B to switch between being connected to the first side 206 and to the rear 204 of the base unit 102, as can be seen in FIG. 7. The first axis A is taken through a center of the base unit 102 extending from the top 242 to the bottom 244 of the base unit 102. The second axis B is taken through the expansion module 104, when oriented and positioned to connect to the first connector 214 at the rear 204 of the base unit 102b, along a line that extends through a center of the base unit 102 extending from the front 202 to the rear 204. Starting from the integrated configuration where the expansion module 104 is positioned at the rear 204 of the base unit 102 (labeled as the reference number 104a, though in FIG. 4, these reference numbers 104a,b,c,d refer to different orientations of the same expansion module 104), the expansion module 104 is rotated 90 degrees about axis A (compare orientation 104a with 104c), and rotated 180 degrees about axis B (in either order) (compare orientation 104c with 104d) to orient the expansion module 104 to connect to the first side 206 of the base unit 102, all without rotating or turning the base unit 102. Unlike in the prior art, the base unit 102 of the present disclosure can remain in the same orientation and position regardless of whether it is configured for DIN-rail mounting or through a door panel 282 with an integrated display 120, and still allow one or more expansion modules 104 to be connected in a manner that permits the various interfaces to external components and systems to be readily accessible from the top 242 and bottom 244 of the housing 102.

The housing 200 houses a backplane, generally designated as 246 in FIG. 6, proximate the rear 204 of the base unit 102. The backplane 246b includes an electrical connector 248 having a female receptacle 250 that is positioned to coincide with the rear opening 212 when the backplane 246b is installed in the integrated base unit 102b. The backplane 246a includes an electrical connector 252 (of the same type as the electrical connector 248) having a female receptacle 254 that is positioned to coincide with the side opening 216.

An overall height H1 and an overall width W1 dimension (labeled in FIG. 7) of the expansion module 104 does not exceed a corresponding overall height H2 and overall width W2 (labeled in FIG. 2) dimension of the base unit 102 or an overall depth D (labeled in FIG. 4) and overall height dimension H2 (labeled in FIG. 2) of the base unit 102.

The base unit 102 has one or more connectors 260, 262, 264, 266, 268, 270, 272 accessible from the top 242 and the bottom 244 of the housing 200, such as shown in FIG. 3. The connectors 260, 262, 264, 266, 268, 270, 272 including one or more of a current input connector for receiving one or more current inputs carrying a current sensed by the sensor, a voltage input connector for receiving one or more voltage inputs providing a voltage sensed by the sensor, a data connector for receiving input and output signals between the meter device and an external system external to the meter device, a power supply connector supplying power signals for powering electronic components of the meter device including, or a communications connector configured to carry communication signals to a remote monitoring and control system or to another meter device like the IED 100. These connectors 260, 262, 264, 266, 268, 270, 272 can correspond to any of the interfaces 108, 112, 114, 116, 122 shown in FIG. 1.

Advantageously, the two different connector placements, either via the side opening 216 or the rear opening 212, allow the reuse of the same body or housing 200 in multiple configurations, such as the DIN-mounted (FIG. 3) and integrated configurations (FIG. 2). Note that the aspects illustrated and described herein can be extended to more than two different connector placements for attaching expansion modules 104, such as three or four, on different surfaces of the base unit 102 of the IED 100. An IED 100 with six surfaces allows for up to six distinct connections on each of the six surfaces. Installation is significantly simplified, particularly in installations involving multiple configurations, reducing the installation time by the end-user. The labels 224, 240 can include safety or other information and can be affixed on the housing 200 so that any text or graphics will be right-side up with respect to a standing human observer when the IED 100 is installed in either configuration. The connectors to external components and systems, such as the connectors 260, 262, 264, 266, 268, 270, 272 can be easily accessed from a rear of the housing 200 in both configurations. Expansion modules 104 can be readily added to the rear 204 or to the side, such as the first side 206, of the IED 100 by two simple rotations of the expansion module 104 and without requiring any rotation of the housing 200 (as seen in FIG. 7). The electronic components inside the housing, with the exception of the connectors 214, 218, can be reused in both configurations without having to design different internal circuits for different configurations. To keep costs low, the manufacturer can provide two different versions of the IED 100, one with the connector 214 only and one with the connector 218 only. Alternately, the manufacturer of the IED 100 can provide both connectors 214, 218 in both configurations, allowing the customer to purchase the same IED 100 for either configuration without requiring the manufacturer to make two versions of the IED 100. The same expansion modules 104 can be used in either configuration and can be stacked on behind another for infinite expansion of the standard capabilities of the IED.

While particular aspects and implementations of the present disclosure have been illustrated and described, it is to be understood that the present disclosure is not limited to the precise construction and compositions disclosed herein and that various modifications, changes, and variations are not only contemplated but also apparent from the foregoing descriptions without departing from the scope of the present disclosure as defined in the appended claims.

What is claimed is:

1. An intelligent electronic device for measuring a characteristic of electricity, comprising:

a housing of a base unit having a front, a rear, a top opposite a bottom, and a first side opposite a second side connected to the front and to the rear, the housing defining an interior volume and including therein a sensor configured to sense a characteristic of electricity, the rear of the housing including a rear opening through which a first connector is accessed when present in the housing, the first connector for connecting to a corresponding connector of an expansion module of a type when mounted to the base unit, and the first side of the housing including a side opening through which a second connector is accessed when present in the housing, the second connector for connecting to the corresponding connector of the expansion module of the same type when mounted to the base unit, wherein the rear opening is located a first distance from the first side and a second distance from the top, and wherein the side opening is located the first distance from the rear and the second distance from the top, such that the corresponding connector of the expansion module, when connected to the base unit, connects to the second connector through the side opening in a side configuration or to the first connection through the rear opening in a rear configuration.

2. The device of claim 1, wherein the front includes a DIN slot configured to engage a DIN rail.

3. The device of claim 2, further comprising a cover positioned on the rear to completely cover the rear opening.

4. The device of claim 1, wherein the front includes a display connector configured to receive a corresponding connector of a display module that has a display module housing and a video display device, the front further including at least one display mount configured to secure the display module to the base unit, causing the display connector to mechanically and electrically couple to the corresponding connector of the display module.

5. The device of claim 4, further comprising a label affixed to the first side to completely cover the side opening.

6. The device of claim 1, wherein the expansion module is rotated in two directions about two different axes to switch between being connected to the first side and to the rear of the base unit.

7. The device of claim 1, further comprising a backplane in the housing proximate the rear of the base unit.

8. The device of claim 7, wherein the backplane includes the first connector having a female receptacle that is positioned to coincide with the rear opening.

9. The device of claim 7, wherein the backplane includes the second connector having a female receptacle that is positioned to coincide with the side opening.

10. The device of claim 1, wherein an overall height and an overall width dimension of the expansion module does not exceed a corresponding overall height and overall width dimension of the base unit or an overall depth and overall height dimension of the base unit.

11. The device of claim 1, wherein the housing includes at least two pieces, wherein each of the side opening and the rear opening spans across the at least two pieces of the housing.

12. The device of claim 1, further comprising a plurality of connectors accessible from the top and the bottom of the housing, the connectors including one or more of a current input connector for receiving one or more current inputs carrying a current sensed by the sensor, a voltage input connector for receiving one or more voltage inputs providing a voltage sensed by the sensor, a data connector for receiving input and output signals between the device and an external system external to the device, a power supply connector supplying power signals for powering electronic components of the device including, or a communications connector configured to carry communication signals to a remote monitoring and control system or to another device, and wherein the IED is a meter device.

13. An intelligent electronic device for measuring a characteristic of electricity, comprising:
   a housing of a base unit having a front, a rear, and a first side opposite a second side connected to the front and to the rear, the housing defining an interior volume and including therein a sensor configured to sense a characteristic of electricity;
   the rear of the housing including a rear opening through which a first connector is accessed when present in the housing, the first connector for connecting to a corresponding connector of an expansion module of a type when mounted to the base unit; and
   the first side of the housing including a side opening through which a second connector is accessed when present in the housing, the second connector for connecting to the corresponding connector of the expansion module of the same type when mounted to the base unit, wherein the first and second connectors are of the same type and have the same or different mating arrangement, and wherein the side opening and the rear opening have the same dimensions.

14. The device of claim 1, wherein the corresponding connector of the expansion module, when the expansion module is mounted to the base unit, is configured to be connected to either the first connector through the side opening or to the second connector through the rear opening.

15. A method of assembling an intelligent electronic device (IED) for measuring a characteristic of electricity, comprising the steps of:
   providing a first housing having a back opening in a back of the first housing and a second housing having a side opening in a side of the second housing;
   selecting the first housing or the second housing based on an installation configuration of the IED, the installation configuration being selected from the group consisting of (a) an integrated configuration in which the IED is mounted through a panel and (b) a DIN-mounted configuration in which the IED is mounted on a DIN rail along a second side opposite the side through which the side opening is provided;
   responsive to the selecting, installing a sensor module into the selected housing to form the IED, the sensor module including a sensor configured to sense a characteristic of electricity; and
   in either order, rotating an expansion module about a first axis extending between a top and a bottom of the IED and rotating the expansion module about a second axis extending between opposite sides of the IED, so as to permit the expansion module to be connected to the sensor module through the back opening or through the side opening.

* * * * *